United States Patent
Dietrich et al.

(10) Patent No.: US 10,931,277 B2
(45) Date of Patent: Feb. 23, 2021

(54) POWER TRANSISTOR GATE-CHARGE HARVESTER FOR INTERNAL SUPPLY GENERATION

(71) Applicant: Texas Instruments Incorporated, Dallas, TX (US)

(72) Inventors: Stefan Dietrich, Freising (DE); Josy Bernard, Freising (DE); Christian Harder, Freising (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/291,675

(22) Filed: Mar. 4, 2019

(65) Prior Publication Data
US 2020/0287534 A1  Sep. 10, 2020

(51) Int. Cl.
| H02M 3/18 | (2006.01) |
| H03K 17/687 | (2006.01) |
| H02M 1/08 | (2006.01) |
| H02M 3/158 | (2006.01) |

(52) U.S. Cl.
CPC ............ *H03K 17/687* (2013.01); *H02M 1/08* (2013.01); *H02M 3/1582* (2013.01)

(58) Field of Classification Search
CPC ...... H03K 2217/0036; H02M 3/33592; H02M 3/335; H02M 1/08; H02M 3/18
See application file for complete search history.

(56) References Cited

U.S. PATENT DOCUMENTS

| 8,278,886 B2 * | 10/2012 | Megaw ............. H03K 17/6871 323/223 |
| 2015/0280570 A1 * | 10/2015 | Su ........................ H03K 17/102 323/271 |

* cited by examiner

*Primary Examiner* — Sibin Chen
(74) *Attorney, Agent, or Firm* — Lawrence J. Bassuk; Charles A. Brill; Frank D. Cimino (57) ABSTRACT

A gate-charge harvester includes a harvest capacitor that has a first plate and a second plate. The second plate is coupled to a lower rail and the first plate is coupled to send a voltage towards a regulator. The gate-charge harvester also includes a low-side harvest transistor having a first terminal coupled to a gate of a low-side power transistor and a second terminal coupled to the first plate.

15 Claims, 9 Drawing Sheets

POWER TRANSISTOR GATE-CHARGE HARVESTER FOR INTERNAL SUPPLY GENERATION

FIELD OF THE DISCLOSURE

Disclosed embodiments relate generally to the field of power control circuits. More particularly, and not by way of any limitation, the present disclosure is directed to a power transistor gate-charge harvester for internal supply generation.

SUMMARY

Disclosed embodiments provide circuitry to recover parts of the power transistor gate-charge during the gate discharge period in order to generate a recycled logic supply voltage. This recycled logic supply voltage replaces portions of an input logic supply voltage, which is generated from input voltage Vin; the recycled logic supply voltage may increase the overall efficiency of the power circuit.

In one aspect, an embodiment of a gate-charge harvester is disclosed. The gate-charge harvester includes a harvest capacitor having a first plate and a second plate, the second plate being coupled to a lower rail; and a low-side harvest transistor having a first terminal coupled to a gate of a low-side power transistor and a second terminal coupled to the first plate, wherein the first plate is further coupled to send a voltage towards a regulator.

In another aspect, an embodiment of an integrated power circuit is disclosed. The integrated power circuit includes a low-side power transistor and a high-side power transistor coupled in series between a first pin and a second pin; a gate driver coupled to provide a low-side gate control signal to a gate of the low-side power transistor and to provide a high-side gate control signal to a gate of the high-side power transistor; and a gate-charge harvester comprising: a harvest capacitor having a first plate and a second plate, the second plate being coupled to a lower rail; a first N-type metal oxide silicon (NMOS) harvest transistor having a first terminal coupled to the gate of the high-side power transistor and a second terminal coupled to the first plate; and a second NMOS harvest transistor having a first terminal coupled to a gate of the low-side power transistor and a second terminal coupled to the first plate, wherein the first plate is further coupled to provide a harvested voltage.

In yet another aspect, an embodiment of an integrated power circuit is disclosed. The integrated power circuit includes a power transistor coupled between a first pin and a second pin; a gate driver coupled to provide a gate control signal to a gate of the power transistor; and a gate-charge harvester comprising: a harvest capacitor having a first plate and a second plate, the second plate being coupled to a lower rail; and an N-type metal oxide silicon (NMOS) harvest transistor having a first terminal coupled to the gate of the power transistor and a second terminal coupled to the first plate; wherein the first plate is further coupled to provide a harvested voltage.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described. As used herein, the term "couple" or "couples" is intended to mean either an indirect or direct electrical connection unless qualified as in "communicably coupled" which may include wireless connections. Thus, if a first device couples to a second device, that connection may be through a direct electrical connection, or through an indirect electrical connection via other devices and connections.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

DETAILED DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Figure 5:
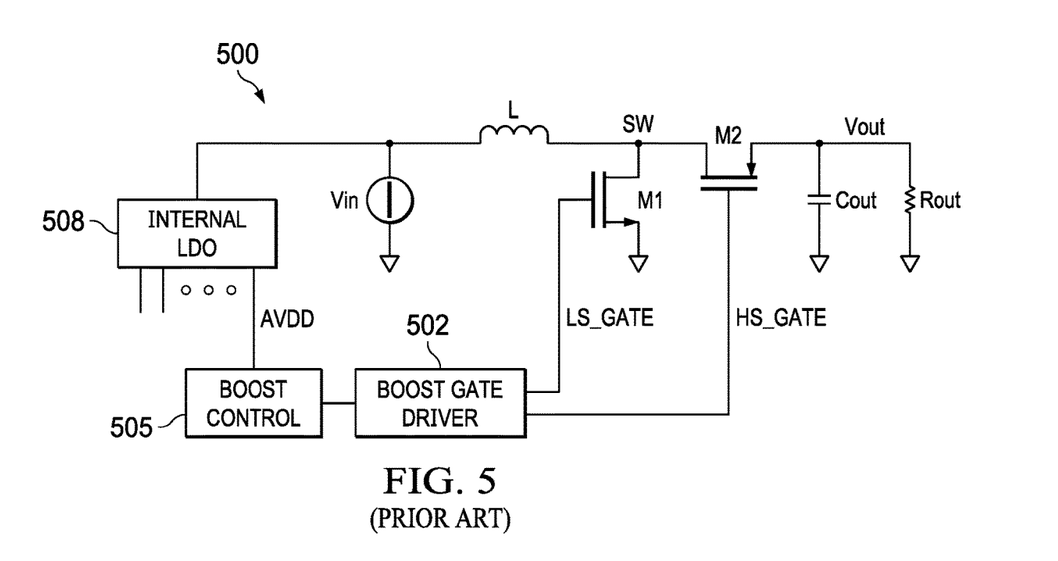
FIG. 5 depicts a block diagram of various circuits within a DC/DC boost converter according to the prior art.

FIG. 5 depicts a high-level block diagram of a DC/DC boost converter 500 according to the prior art. DC/DC boost converter 500 depicts an input voltage Vin, which is coupled to switch-node SW through an inductor L. Low-side power transistor M1 is coupled in series with high-side power transistor M2 between the lower rail, which can be a ground plane, and an output voltage Vout, which is shown coupled to an output capacitor Cout and a load represented by output resistor Rout. In the embodiment shown, low-side power transistor M1 is an N-type metal oxide silicon (NMOS) power transistor and high-side power transistor M2 is a P-type metal oxide silicon (PMOS) power transistor, although these are not limitations. The gate of low-side power transistor M1 is coupled to receive low-side gate control signal LS_GATE and high-side power transistor M2 is coupled to receive high-side gate control signal HS_GATE, both of which control signals are provided by boost gate driver 502. Boost gate driver 502 receives control signals from boost control circuit 505. Power to operate boost control circuit 505 and boost gate driver 502 is provided by internal low dropout (LDO) regulator 508, which is responsible for generating both a gate driver supply voltage Vmax (not specifically shown in this figure) and a logic supply voltage AVDD from the input voltage. Internal LDO regulator 508 can also supply logic supply voltage AVDD to other control circuits and to any additional circuit, such as monitoring circuits (not specifically shown). Gate driver supply voltage Vmax is the greater of input voltage Vin and output voltage Vout. Internal LDO regulator 508 can sometimes draw large currents in order to operate DC/DC boost converter 500, so it is desirable to improve the system efficiency. The present disclosure is directed to reducing this problem by harvesting a portion of the gate charge on low-side power transistor M1 and high-side power transistor M2 to provide a portion of the logic supply voltage AVDD. The gate charge is otherwise routed to the ground plane and lost each time the gate is discharged. In order to better understand how this gate charge is harvested, we first look more closely at boost gate driver 502.

Figure 6:
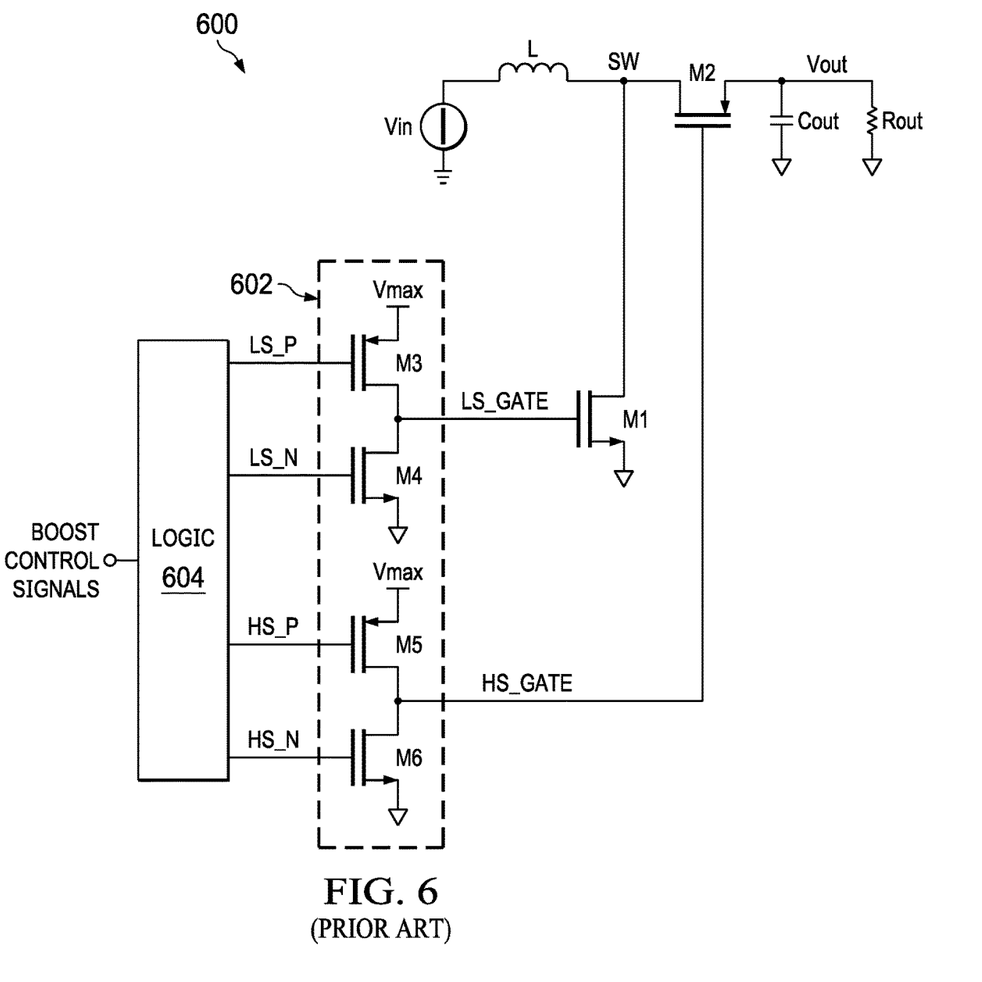
FIG. 6 depicts an example of a DC/DC boost converter according to the prior art.

FIG. 6 depicts a somewhat more detailed example of a DC/DC boost converter 600 according to the prior art. DC/DC boost converter 600 again includes low-side power transistor M1 and high-side power transistor M2 that are coupled in series between the lower rail and an output node that provides output voltage Vout. A switch-node SW between low-side power transistor M1 and high-side power transistor M2 is coupled to an input voltage Vin through an inductor L. Output transistor Cout is coupled between the output voltage Vout and the lower rail; output resistor Rout represents the load on the output.

Gate driver 602 is an example embodiment of boost gate driver 502. Gate driver 602 is coupled to the gate of low-side power transistor M1 and to the gate of high-side power transistor M2 and includes four gate control transistors. A first P-type gate control transistor M3 is coupled in series with a first N-type gate control transistor M4 between gate driver supply voltage Vmax and the lower rail, with a node between first P-type gate control transistor M3 and first N-type gate control transistor M4 providing a low-side gate control signal LS_GATE. Similarly, a second P-type gate control transistor M5 is coupled in series with a second N-type gate control transistor M6 between gate driver supply voltage Vmax and the lower rail, with a node between second P-type gate control transistor M5 and second N-type gate control transistor M6 providing a high-side gate control signal HS_GATE. A logic circuit 604 receives one or more boost control signals, which are provided by the previously mentioned voltage control and/or current control. Logic circuit 604 provides four intermediate control signals: low-side-P control signal LS_P, low-side-N control signal LS_N, high-side-P control signal HS_P and high-side-N control signal HS_N respectively to the gates of gate control transistors M3, M4, M5, M6.

Figure 7:
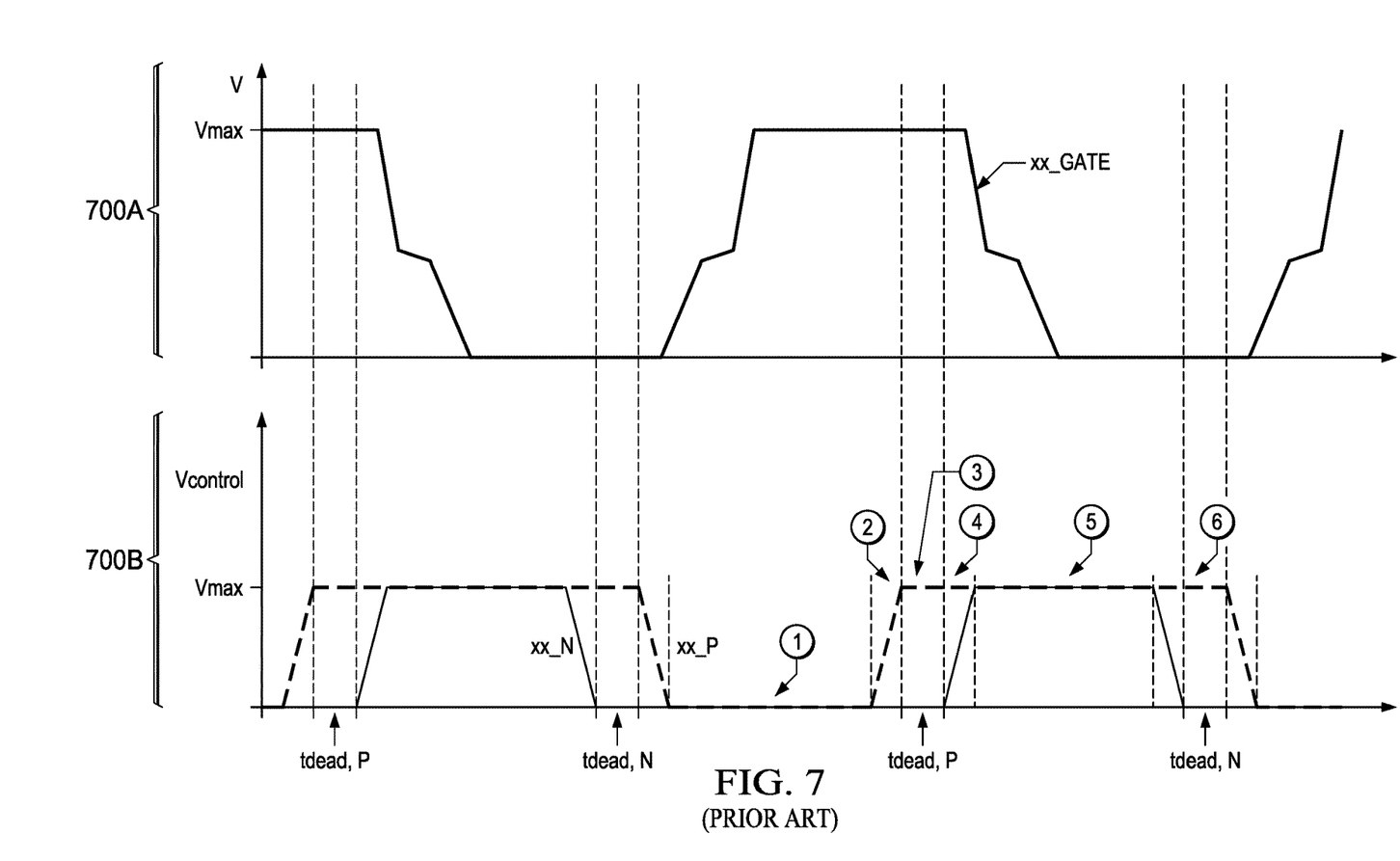
FIG. 7 depicts various voltage levels during operation of the circuit of FIG. 6.

FIG. 7 depicts the timing related to driving one of low-side power transistor M1 and high-side power transistor M2. FIG. 7 contains two graphs 700A, 700B. Graph 700A depicts the voltage on the gate of a power transistor. Although low-side power transistor M1, which is NMOS, is turned on by the gate going high and high-side power transistor M2, which is PMOS, is turned off by the gate going high, the gates of these two power transistors are driven in the same manner. Because of the similar gate-drive approach, only one example waveform is given, where the designations LS_GATE and HS_GATE are replaced by power gate control signal xx_GATE to indicate that the voltage illustrated can refer to either high-side gate control signal HS_GATE or low-side gate control signal LS_GATE. Graph 700B depicts the voltages on the respective gate control transistors of gate driver 602 that drive the power gate control signal xx_GATE shown in graph 700A. Similarly to the upper graph, the designations LS_P and HS_P are replaced by intermediate-P control signal xx_P to indicate that the voltage can refer to either the voltage on low-side-P control signal LS_P or high-side-P control signal HS_P and the designations LS_N and HS_N are replaced by intermediate-N control signal xx_N to indicate that the voltage can refer to either the voltage on low-side-N control signal LS_N or high-side-N control signal HS_N.

A gate driver non-overlap between intermediate-P control signal xx_P and intermediate-N control signal xx_N is necessary to avoid cross-conduction. This non-overlap is shown and labelled as P-dead time Tdead,p and N-dead time Tdead,n, which are well controlled. During both P-dead time Tdead,p and N-dead time Tdead,n, power gate control signal xx_GATE is high-impedant. To explain the characteristic gate-drive behavior of a power gate control signal xx_GATE, the transition of intermediate-P control signal xx_P and intermediate-N control signal xx_N in the region surrounding P-dead time Tdead,p is divided into six time periods, indicated by the circled numbers 1-6. For ease in distinguishing the time periods, P-dead time Tdead,p and N-dead time Tdead,n are delineated by long dotted lines, while the other time periods are delineated by shorter dotted lines.

During time period (1), both of intermediate-N control signal xx_N and intermediate-P control signal xx_P are coupled to ground. Intermediate-P control signal xx_P causes a corresponding P-type gate control transistor, either first P-type gate control transistor M3 or second P-type gate control transistor M5 to conduct current and intermediate-N control signal xx_N causes a corresponding N-type gate control transistor, either first N-type gate control transistor M4 or second N-type gate control transistor M6 to be turned off. This results in the corresponding power gate control signal xx_GATE being high potential, which in FIG. 6 is the value of gate driver supply voltage Vmax. During time period (2), the intermediate-N control signal xx_N remains off and the intermediate-P control signal xx_P rises. During P-dead time Tdead,p, which is also time period (3), both of the gate control transistors associated with intermediate-N control signal xx_N and intermediate-P control signal xx_P are in the off state and the power gate control signal xx_GATE is high-impedant. This P-dead time Tdead,p, which occurs after the rise of intermediate-P control signal xx_P and before the rise of intermediate-N control signal xx_N, is used to avoid a potential cross-current between gate driver supply voltage Vmax and the ground plane and also to increase the efficiency. During time period (4), the P-dead time Tdead,p has ended and the voltage on intermediate-N control signal xx_N rises to gate driver supply voltage Vmax. The increasing voltage on intermediate-N control signal xx_N begins to pull the voltage on power gate control signal xx_GATE to ground. During time period (5), the dynamic transition of power gate control signal xx_GATE ends with power gate control signal xx_GATE at low potential. During time period (6), which extends until intermediate-P control signal xx_P is at ground, a reverse operation turns off intermediate-N control signal xx_N and intermediate-P control signal xx_P, which will cause the power gate control signal xx_GATE to charge to high potential again.

Figure 1A:
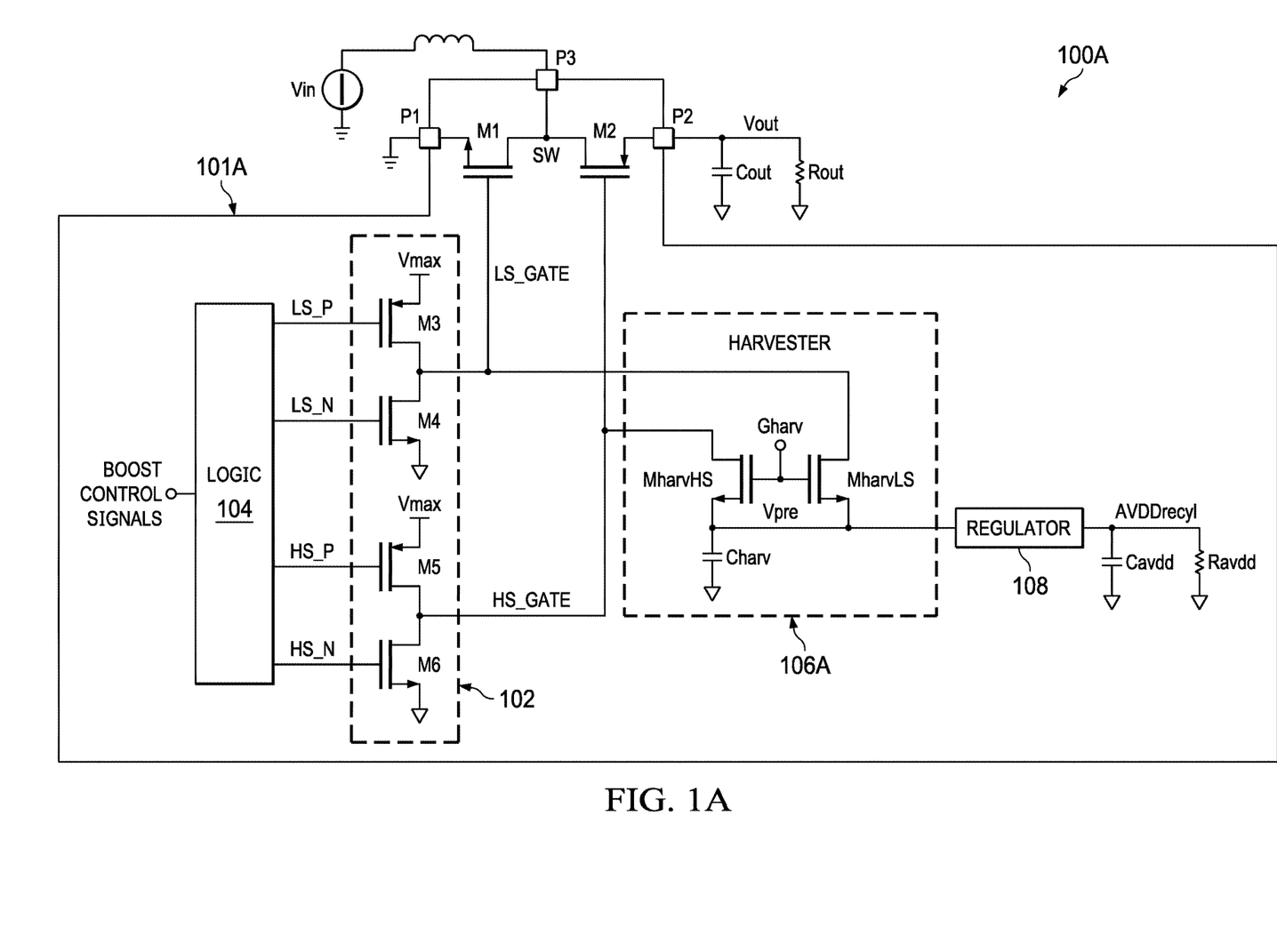
FIG. 1A depicts an example of a DC/DC boost converter containing a gate-charge harvester according to an embodiment of the disclosure.

FIG. 1A depicts an example of a DC/DC boost converter 100A embodied in an integrated circuit chip 101A and containing a gate-charge harvester 106A according to an embodiment of the disclosure. DC/DC boost converter 100A contains low-side power transistor M1 and high-side power transistor M2 coupled in series between a first pin P1 and a second pin P2, with switch-node SW coupled to a third pin. During operation of DC/DC boost converter 100A, first pin P1 is coupled to a ground plane, second pin P2 is coupled to an output capacitor Cout and to a load represented by resistor Rout, and third pin P3 is coupled to inductor L and through inductor L to input voltage Vin. For simplicity and without loss of generality, the gates of low-side power transistor M1 and high-side power transistor M2 are assumed to withstand both gate driver supply voltage Vmax in case of low-side power transistor M1 and the ground plane in case of high-side power transistor M2, so that the maximum allowed gate/source or gate/bulk potentials are not violated. In other embodiments (not specifically shown), the high potential of low-side gate control signal LS_GATE and the low potential of high-side gate control signal HS_GATE are clamped to a safe potential, such that the gates of low-side power transistor M1 and high-side power transistor M2 are safe.

Low-side power transistor M1 and high-side power transistor M2 are enabled anti-phased, such that DC/DC boost converter 100A operates in a continuous operation to charge and discharge the inductor L for energy transfer towards the output capacitor Cout. The turn on and off of the gates of low-side power transistor M1 and high-side power transistor M2 show a characteristic non-overlap behavior to avoid cross-conduction. This non-overlap is ensured by a proper gate drive topology provided by logic circuit 104 to control low-side gate control signal LS_GATE and high-side gate control signal HS_GATE through gate driver 102. A similar gate-drive non-overlap between the low-side-P control signal LS_P and low-side-N control signal LS_N, as well as between high-side-P control signal HS_P and high-side-N control signal HS_N is typically implemented to avoid gate-driver cross-conduction. This method is especially important in high-power and/or high efficiency systems, where low-side power transistor M1 and high-side power transistor M2 are huge and also require a non-negligible gate-drive circuitry, or in systems where the peak efficiency and/or light-load efficiency are critical.

Gate driver 102 contains first P-type gate control transistor M3 and first N-type gate control transistor M4, which are coupled in series between gate driver supply voltage Vmax and the lower rail to provide low-side gate control signal LS_GATE, and second P-type gate control transistor M5 and second N-type gate control transistor M6, which are coupled in series between gate driver supply voltage Vmax and the lower rail to provide high-side gate control signal HS_GATE. Gate driver 102 receives low-side-P control signal LS_P, low-side-N control signal LS_N, high-side-P control signal HS_P and high-side-N control signal HS_N from logic circuit 104, which itself receives boost control signals as input.

Gate-charge harvester 106A contains two transistors that control the harvest of the gate charge and a capacitor on which the harvested gate charge can be temporarily stored. Low-side harvest transistor MharvLS is coupled between low-side gate control signal LS_GATE and a first plate of harvest capacitor Charv and high-side harvest transistor MharvHS is coupled between high-side gate control signal HS_GATE and the first plate of harvest capacitor Charv. In each of the examples given in this application, low-side harvest transistor MharvLS and high-side harvest transistor MharvHS are shown as NMOS transistors for simplicity, although any type of transistor can be utilized. A harvest gate control signal Gharv controls the timing of low-side harvest transistor MharvLS and high-side harvest transistor MharvHS. A second plate of harvest capacitor Charv is coupled to the lower rail. As will be shown below, the harvested voltage Vpre is an unregulated voltage that is less than gate driver supply voltage Vmax and greater than logic supply voltage AVDD. Harvested voltage Vpre can also vary considerably over time and is not appropriate to be utilized as a supply voltage. Therefore, harvested voltage Vpre is provided to a harvest regulator 108 that can regulate the harvested voltage Vpre to generate recycled logic supply voltage AVDDrecyl on AVDD capacitor Cavdd to supply resistor load Ravdd. Harvest regulator 108 can be a simple LDO regulator or any other circuit that generates a recycled logic supply voltage AVDDrecyl having a controlled voltage from uncontrolled harvested voltage Vpre. How the operation of gate-charge harvester 106A fits in with the operation of gate driver 102 is explained with reference to FIG. 2.

Figure 2:
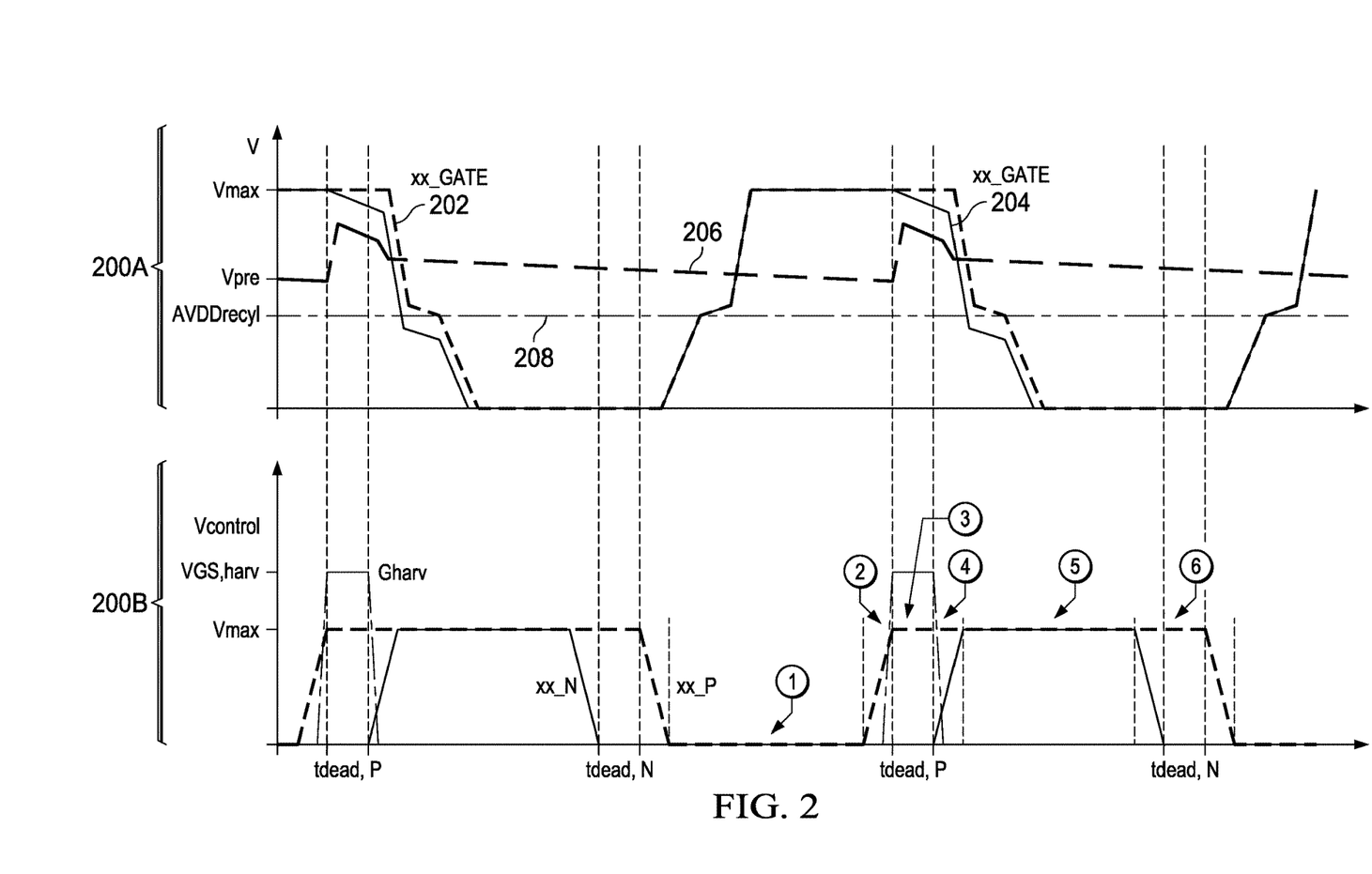
FIG. 2 depicts various voltage levels during operation of the circuit of FIG. 1A according to an embodiment of the disclosure.

FIG. 2 is similar to FIG. 7, but depicts the differences brought about by gate-charge harvester 106A. Graph 200A again depicts the charge on power gate control signal xx_GATE, with power gate control signal 202 depicting the loss of charge when there is no harvest of the charge and power gate control signal 204 depicting the loss of charge when there is a harvest of the charge. Also shown are the harvested voltage Vpre 206 and the recycled logic supply voltage AVDDrecyl. Graph 200B again depicts the intermediate-N control signal xx_N and intermediate-P control signal xx_P and also depicts the harvest gate control signal Gharv.

The transition of intermediate-P control signal xx_P and intermediate-N control signal xx_N during time period Tdead,P is again divided into six parts, which are again indicated by the circled numbers 1-6. During time period (1), both intermediate-N control signal xx_N and intermediate-P control signal xx_P are connected to the ground plane. The low value on intermediate-P control signal xx_P causes a corresponding one of first P-type gate control transistor M3 and second P-type gate control transistor M5 to conduct current. The low value on intermediate-N control signal xx_N causes a corresponding one of first N-type gate control transistor M4 and second N-type gate control transistor M6 to be off. The power gate control signal xx_GATE is high potential, which has a value equal to gate driver supply voltage Vmax in this example. At time period (2), the intermediate-N control signal xx_N remains low and intermediate-P control signal xx_P rises to a high potential. At the beginning of P-dead time Tdead,P, which is also time period (3), intermediate-N control signal xx_N is holding a respective one of N-type gate control transistors M4, M6 in the off state and intermediate-P control signal xx_P is holding a respective one of P-type gate control transistors M3, M5 in the off state.

As soon as both intermediate control transistors xx_N and xx_P are holding their respective gate control transistors off in time period (3), harvest gate control signal Gharv is pulled to high potential, such that the corresponding gate/source voltage Vgs,harv is now greater than the harvested voltage Vpre plus the threshold voltage Vth of the harvest transistors and low-side harvest transistor MharvLS and high-side harvest transistor MharvHS are enabled. Instead of power gate control signal xx_GATE having a floating potential, as indicated by the old waveform in power gate control signal 202, the power gate control signal 204 now decreases by the harvest current as indicated by the waveform. The harvested voltage Vpre 206 then increases to near the value of power gate control signal xx_GATE 204 and follows the gate potential until the end of the P-dead time Tdead,P.

During time period (4), the intermediate-N control signal xx_N rises to a high potential and starts pulling power gate control signal xx_GATE to a low potential. At the same time, harvest gate control signal Gharv is pulled to low potential to stop the harvest. The power gate control signal 204 is now further discharged to a low potential and harvested voltage Vpre on harvest capacitor Charv is at a high value due to the sampling of power gate control signal 204. During time periods (5) and (6), the gate-switching is not changed from older switching patterns. From the uncontrolled harvested voltage Vpre 206, a post-regulator such as harvest regulator 108 further down-converts the charge stored on harvest capacitor Charv to logic supply voltage AVDDrecyl, which can be stored on logic-level capacitor Cavdd and supplied to the resistor load Ravdd.

Given the need to also provide a dead time between low-side power transistor M1 and high-side power transistor M2, one skilled in the art will understand that although FIG. 1A depicts a single harvest gate control signal Gharv for simplicity, a low-side harvest gate control signal GharvLS and a high-side harvest gate control signal GharvHS can be utilized to separately control the timing of the gate harvest from the power transistors, as will be shown in other examples.

Figure 3:
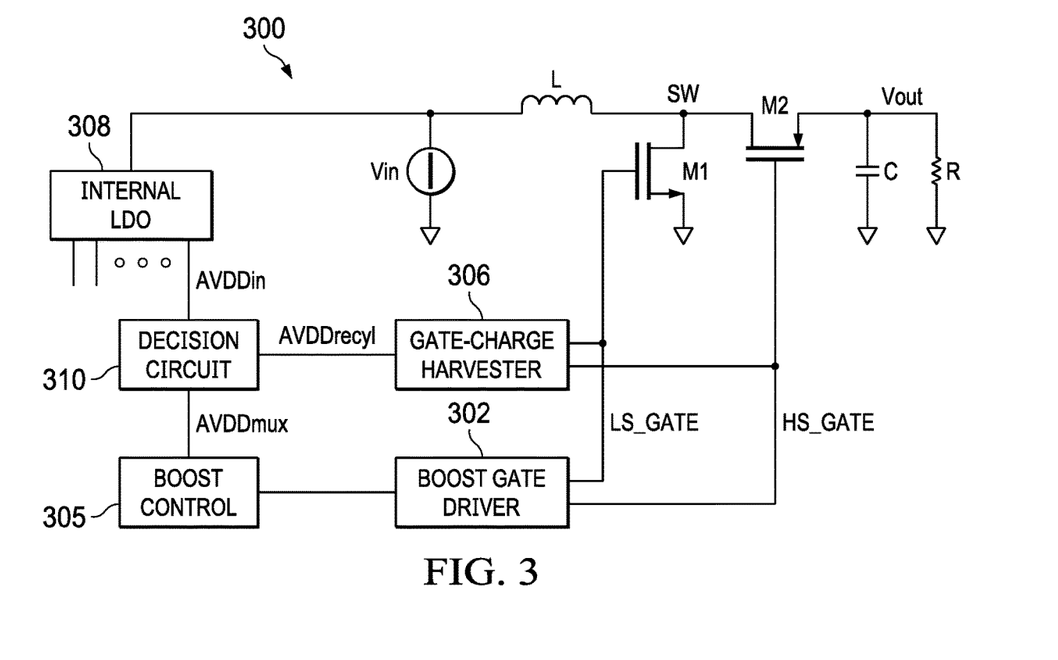
FIG. 3 depicts a block diagram of various circuits within a DC/DC boost converter according to an embodiment of the disclosure.

FIG. 3 depicts a high-level block diagram of DC/DC boost converter 300 according to an embodiment of the disclosure. A distinction is made in this figure between an input logic supply voltage AVDDin, a recycled logic supply voltage AVDDrecyl and a multiplexed logic supply voltage AVDDmux that includes both AVDDin and AVDDrecl. The previously seen internal LDO regulator 308, which supplies power rails to boost control circuit 305 and boost gate driver 302, is now supported in providing the power rails by gate-charge harvester 306 and decision circuit 310. Gate-charge harvester 306 is coupled to harvest a portion of the gate charge on low-side power transistor M1 and high-side power transistor M2 any time there is switching activity on low-side power transistor M1 and high-side power transistor M2. After regulation of the harvested voltage Vpre, the results are provided to decision circuit 310 as recycled logic supply voltage AVDDrecyl. Decision circuit 310 multiplexes the input logic supply voltage AVDDin from internal LDO regulator 308 and the recycled logic supply voltage AVDDrecyl from gate-charge harvester 306 to provide multiplexed logic supply voltage AVDDmux. Because there can be time periods during the operation of DC/DC boost converter 300 when low-side power transistor M1 and high-side power transistor M2 are not switching, decision circuit 310 must guarantee that the use of recycled logic supply voltage AVDDrecyl does not interfere with critical switching operations. In one embodiment, decision circuit 310 utilizes the recycled logic supply voltage AVDDrecyl to supply only portions of the boost converter that are not switching-critical. In one embodiment, decision circuit 310 ensures appropriate multiplexing of input logic supply voltage AVDDin and recycled logic supply voltage AVDDrecyl as soon as the switching of low-side power transistor M1 and high-side power transistor M2 starts or stops and the recycled logic supply voltage AVDDrecyl is built-up or collapses.

Figure 4A:
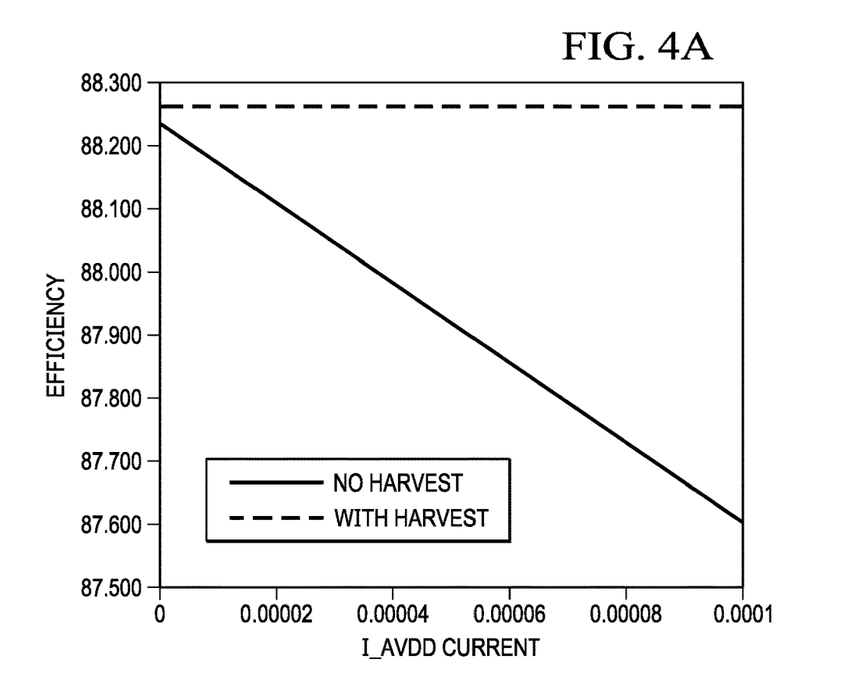
FIG. 4A is directed to simulations comparing the efficiency of AVDD supply current generation across increasing logic-level current loads in a circuit containing the disclosed gate-charge harvester versus a prior art circuit with no gate-charge harvester.

FIG. 4A is directed to simulations comparing the efficiency of AVDD supply current generation across increasing logic-level current loads in a circuit containing the disclosed gate-charge harvester versus a prior art circuit with no gate-charge harvester. Current consumption over increasing levels of current load I_AVDD was first simulated, with Table 1 showing results for the prior art circuit and Table 2 providing results for the circuit with a gate-charge harvester.

TABLE 1

| Without gate-charge harvester | | | | |
|---|---|---|---|---|
| I_AVDD | I_SUM | I_VMAX | I_VIN | I_HARV |
| 0 | 1.334 mA | 1.33 mA | 4.5 uA | 0 |
| 20 uA | 1.354 mA | 1.33 mA | 24.5 uA | 0 |
| 40 uA | 1.374 mA | 1.33 mA | 44.4 uA | 0 |
| 60 uA | 1.393 mA | 1.3 3mA | 64.3 uA | 0 |
| 80 uA | 1.413 mA | 1.33 mA | 84.2 uA | 0 |
| 100 uA | 1.433 mA | 1.33 mA | 104 uA | 0 |

In these tables, I_AVDD is the current load, I_VMAX is the current generated to provide the gate driver supply voltage, I_VIN is the current generated to supply the logic supply voltage, I_SUM is the sum of the generated currents (I_VMAX+I_VIN) and I_HARV is the current harvested by the disclosed gate-charge harvester. In Table 1, no gate-charge was harvested and harvested current I_HARV is zero for all values of current load I_AVDD. As the value of current load I_AVDD increases, the gate current drawn as I_MAX remains the same but the current I_VIN generated to supply the logic supply voltage increases, so that I_SUM also increases as current load I_AVDD increases.

TABLE 2

| With gate-charge harvester | | | | |
|---|---|---|---|---|
| I_AVDD | I_SUM | I_VMAX | I_VIN | I_HARV |
| 0 | 1.33 mA | 1.33 mA | 0 | 0 |
| 20 uA | 1.33 mA | 1.33 mA | 0 | 24.5 uA |
| 40 uA | 1.33 mA | 1.33 mA | 0 | 44.4 uA |
| 60 uA | 1.33 mA | 1.33 mA | 0 | 64.3 uA |
| 80 uA | 1.33 mA | 1.33 mA | 0 | 84.2 uA |
| 100 uA | 1.33 mA | 1.33 mA | 0 | 104 uA |

In Table 2, a gate-charge harvester is providing the logic supply voltage, so that there is no need to generate current I_VIN for this purpose. Since the current generated to supply the gate driver supply voltage I_VMAX is constant, the value of I_SUM is also constant. Based on the values of the sum of generated current I_SUM shown in the above two tables, an efficiency calculation was made with input voltage Vin equal to 3.8 V, output voltage Vout equal to 4.6 V and output current Iout equal to 10 mA. The results are shown in Table 3 below and in FIG. 4A, which depicts the efficiency of the prior art circuit as decreasing linearly as current load I_AVDD increases, while the efficiency of the disclosed circuit remains constant across values of current load I_AVDD.

TABLE 3

| | Efficiency improvement | | |
|---|---|---|---|
| I_AVDD | Efficiency Without harvest | Efficiency With harvest | Efficiency Improvement |
| 0 | 88.236 | 88.261 | 0.026 |
| 20 u | 88.107 | 88.261 | 0.154 |
| 40 u | 87.979 | 88.261 | 0.282 |
| 60 u | 87.858 | 88.261 | 0.404 |
| 80 u | 87.730 | 88.261 | 0.531 |
| 100 u | 87.603 | 88.261 | 0.658 |

Figure 4B:
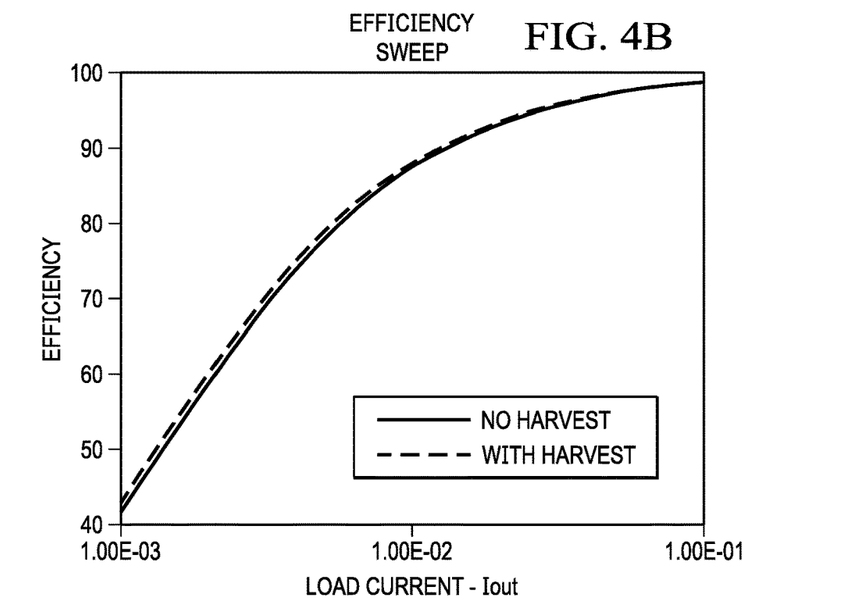
FIG. 4B depicts an efficiency calculation of the both the prior art circuit of FIG. 5 and the disclosed circuit of FIG. 1A over a range of the output current Iout.
Figure 4C:
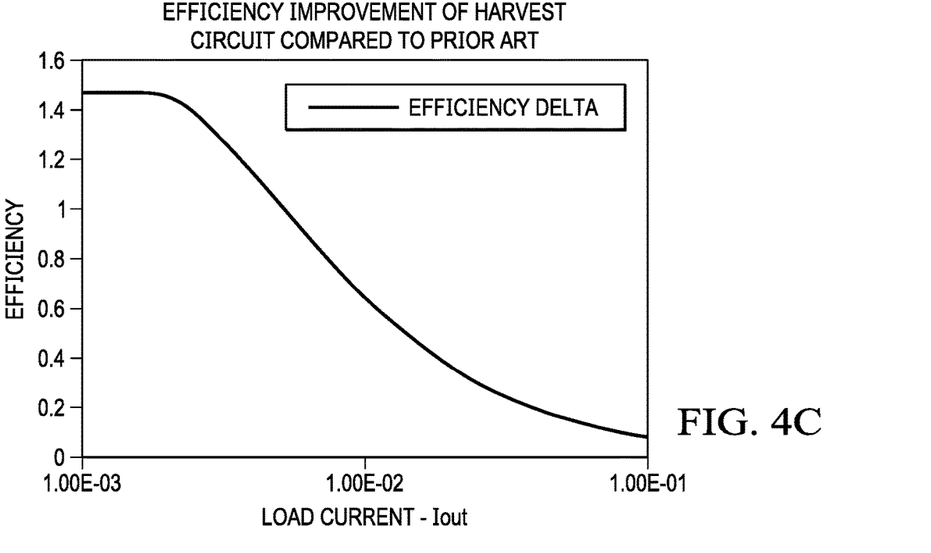
FIG. 4C depicts the increase in efficiency provided by the disclosed gate-charge harvester.

FIG. 4B depicts the efficiency calculation of the both the prior art circuit of FIG. 5 and the disclosed circuit of FIG. 1A over a range of the output current Iout. In FIG. 4B, the efficiency of both circuits increases as the output current Iout increases. At the lowest output current Iout having a value of 1.00E-03, the use of the disclosed gate-charge harvester provides a small but clear improvement, while at the highest output current Iout having a value of 1.00E-01, the efficiency is virtually identical. The efficiency improvement over the prior art is more clearly quantified in FIG. 4C. In this curve, it can be seen that the disclosed gate-charge harvester provides about 1.44 percent increase in efficiency at the lowest output current Iout of 1.00E-3 and about 0.08 percent increase in efficiency at the highest output current Iout of 1.00E-1.

Simulations were also performed to determine the ramp times of harvested voltage Vpre and recycled logic supply voltage AVDDrecyl. The rate at which harvested voltage Vpre ramps up is dependent on the size of harvest transistors MharvLS and MharvHS, while the rate at which recycled logic supply voltage AVDDrecyl ramps up is dependent on the bandwidth of regulator 108. The simulations were performed with an input voltage Vin 3.8 V and an output voltage Vout of 4.6 V. In one embodiment, harvested voltage Vpre ramped to an average voltage of about 4.5 V in about 10 µs and recycled logic supply voltage AVDDrecyl ramped to a value of about 1.8 V in approximately 60 µs.

Figure 1B:
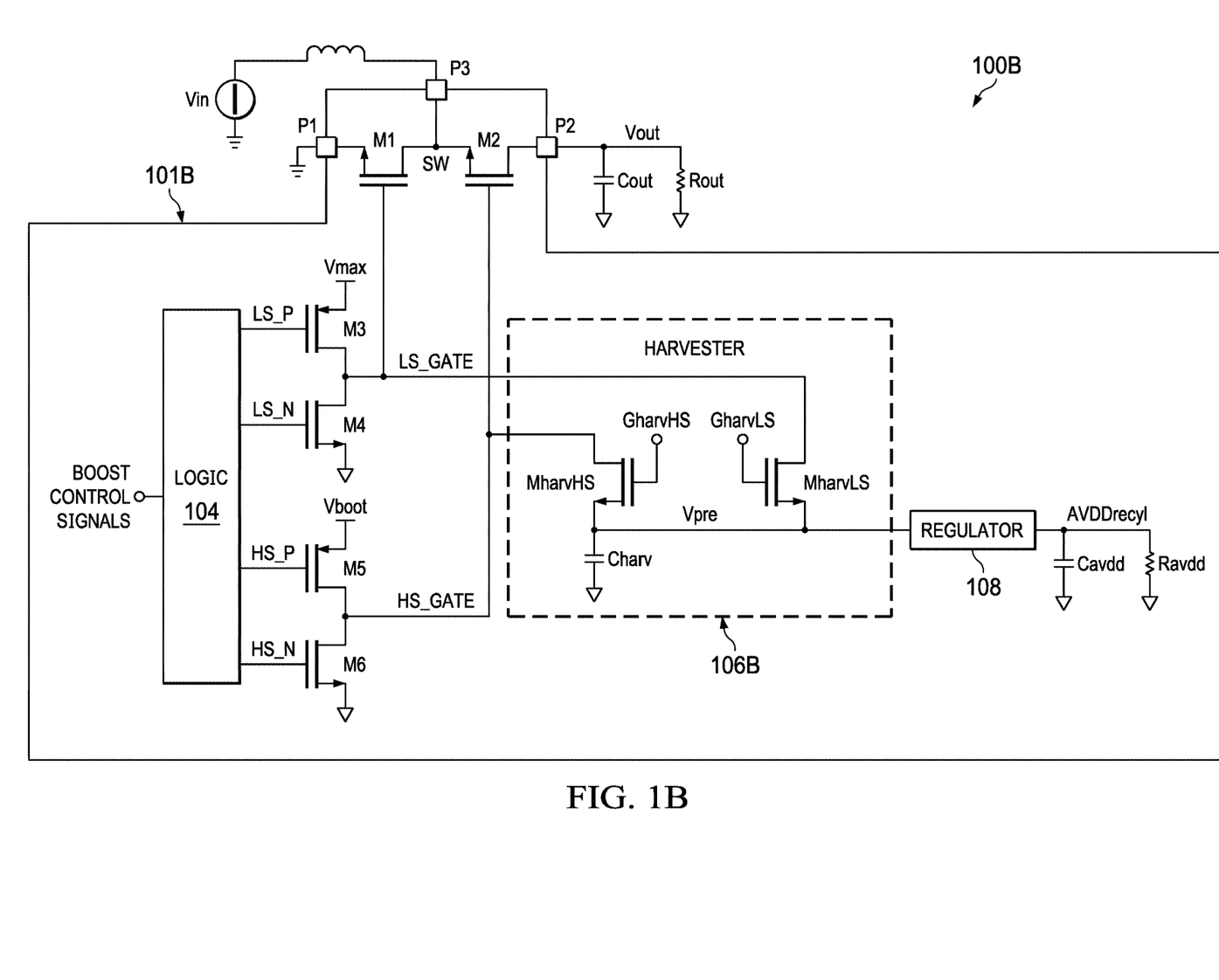
FIG. 1B depicts an example of a DC/DC boost converter containing a gate-charge harvester according to an embodiment of the disclosure.

While gate-charge harvester 106A has been disclosed as part of a DC/DC boost converter 100A having a PMOS power transistor for high-side power transistor M2, other circuits in which the disclosed gate-charge harvester can be utilized will now be briefly discussed. FIG. 1B depicts a DC/DC boost converter 100B implemented on an IC chip 101B and containing a gate-charge harvester 106B according to an embodiment of the disclosure. DC/DC boost converter 100B is similar to DC/DC boost converter 100A in most respects, but differs in several important ways. To avoid repetition, the similarities are not repeated and only the differences are noted. In DC/DC boost converter 100B, rather than having a PMOS power transistor for the high-side power transistor M2, an NMOS power transistor is utilized instead. As is known, a bootstrapped gate-driver (not specifically shown) provides a bootstrap voltage Vboot to the high-side driver circuit. Additionally, while a single harvest gate control signal Gharv was shown in gate-charge harvester 106A, gate-charge harvester 106B contains two separate gate control signals. High-side harvest gate control signal GharvHS is provided to high-side harvest transistor MharvHS and low-side harvest gate control signal GharvLS is provided to low-side harvest transistor MharvLS. In at least one embodiment, the low-side harvest gate control signal GharvLS is coupled to be high during a first dead time for both first P-type gate control transistor M3 and first N-type gate control transistor M4, the first dead time occurring when first P-type gate control transistor M3 has been turned off and N-type gate control transistor M4 has not yet been turned on. Similarly, the high-side harvest gate control signal GharvHS is coupled to be high during a second dead time for both second P-type gate control transistor M5 and second N-type gate control transistor M6, the second dead time occurring when second P-type gate control transistor M5 has been turned off and second N-type gate control transistor M6 has not yet been turned on.

Figure 1C:
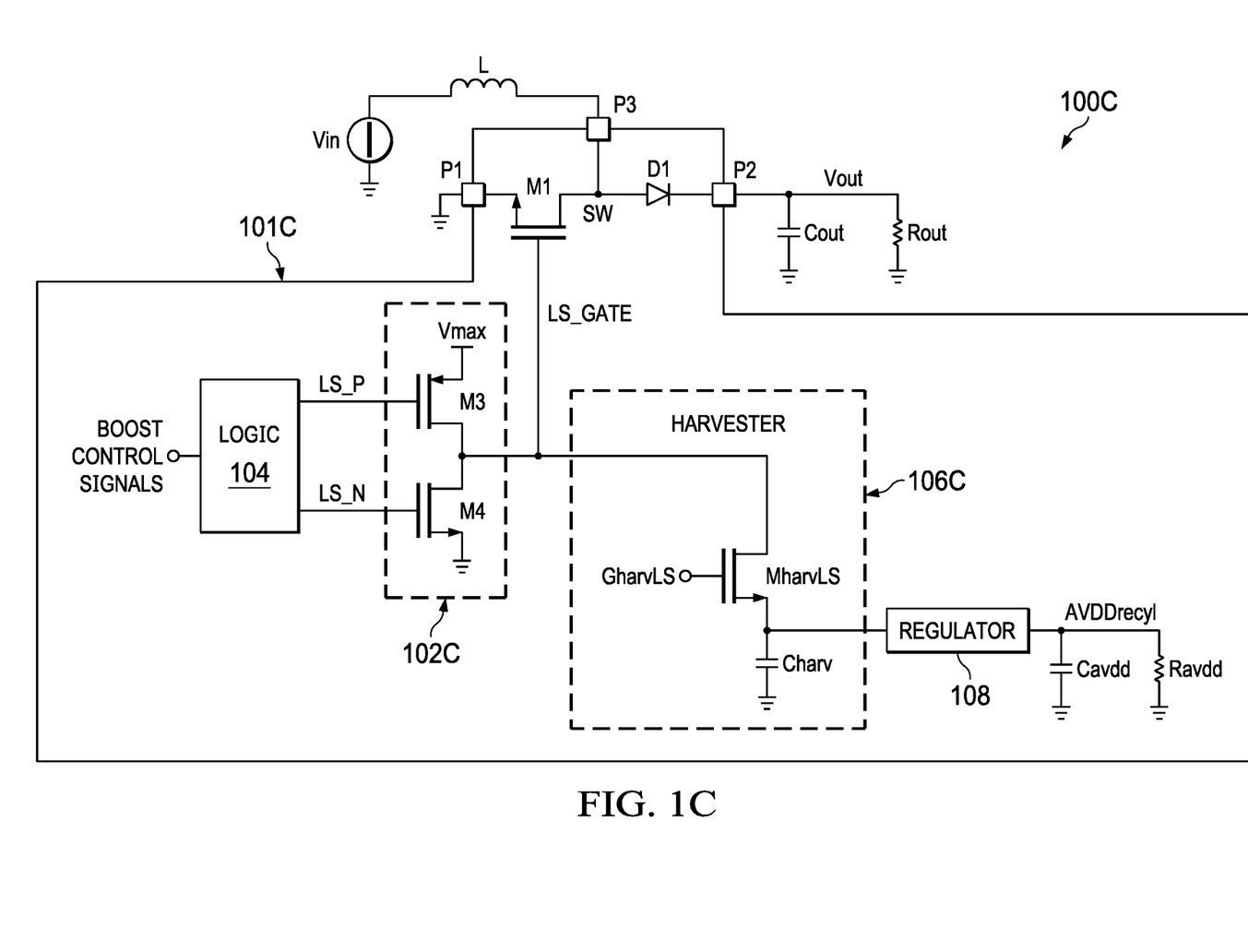
FIG. 1C depicts an example of a DC/DC boost converter containing a gate-charge harvester according to an embodiment of the disclosure.

FIG. 1C depicts DC/DC boost converter 100C implemented on an IC chip 101C and containing a low-side power transistor M1 coupled in series with a diode D1 between first pin P1 and second pin P2. Switch node SW lies between low-side power transistor M1 and diode D1. During operation of DC/DC boost converter 100C, first pin P1 is coupled to the ground plane, pin P2 is coupled to an output capacitor Cout to provide an output voltage Vout to a load represented by resistor Rout. Because only a single power transistor is utilized in this application, gate driver 102C contains only first P-type gate control transistor coupled in series with first N-type gate control transistor between gate driver supply voltage Vmax and the lower rail and receives low-side-P control signal LS_P and high-side-N control signal LS_N from logic circuit 104. Gate-charge harvester 106C includes low-side harvest transistor MharvLS, which is coupled between the gate of low-side power transistor M1 and the first plate of harvest capacitor Charv.

Figure 1D:
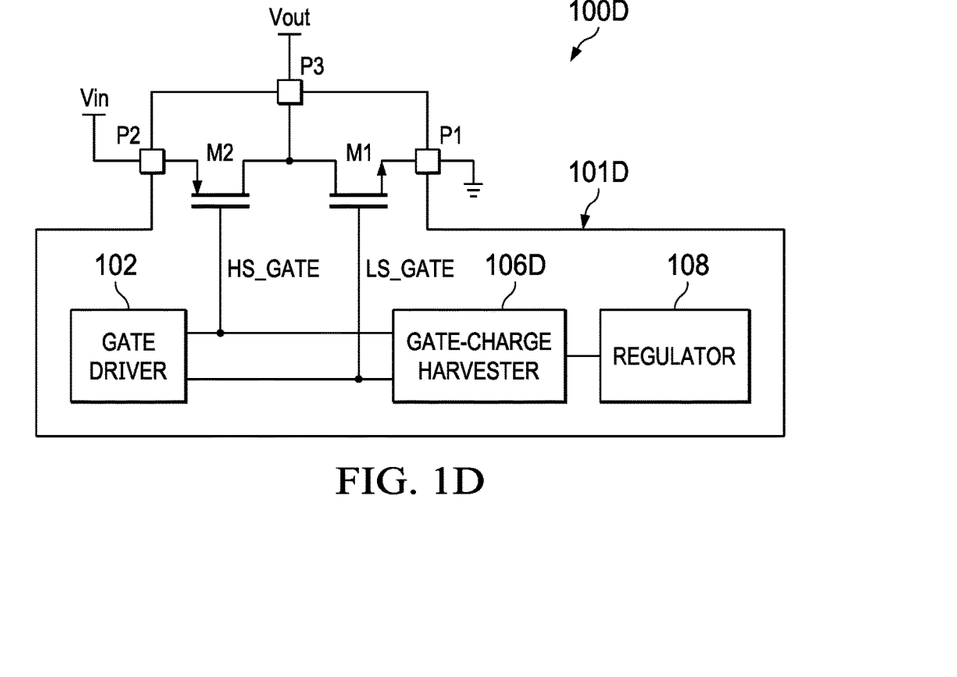
FIG. 1D depicts an example of a DC/DC buck converter containing a gate-charge harvester according to an embodiment of the disclosure.

FIG. 1D depicts a high-level block diagram of a DC/DC buck converter 100D implemented on an IC chip 101D and containing a gate-charge harvester 106D according to an embodiment of the disclosure. For DC/DC buck converter 100D, low-side power transistor M1 is coupled in series with high-side power transistor M2 between first pin P1 and second pin P2. A node between low-side power transistor M1 and high-side power transistor M2 is coupled to a third pin P3. During operation of DC/DC buck converter 100D, pin P1 is coupled to the ground plane, pin P2 is coupled to an input voltage Vin and pin P3 is coupled to provide an output voltage Vout. Gate driver 102 is again coupled to provide low-side gate control signal LS_GATE to the gate of low-side power transistor M1 and to provide high-side gate control signal HS_GATE to the gate of high-side power transistor M2. Gate-charge harvester 106D operates in a manner similar to gate-charge harvesters 106A, 106B as previously described. In the embodiment shown, high-side power transistor M2 is a PMOS power transistor and low-side power transistor M1 is an NMOS power transistor. However, it will be understood that both high-side power transistor M2 and low-side power transistor M1 can be NMOS power transistors. In one embodiment, high-side power transistor M2 can be replaced by a diode, as was shown in FIG. 1C.

Applicants have disclosed a gate-charge harvester to harvest a portion of the gate charge from one or more power transistors that is currently wasted when the gate of the power transistors are discharged. The gate-charge harvester requires only a corresponding harvest transistor for each power transistor, with a harvest control signal providing appropriate timing of the charge harvesting and a harvest capacitor on which to store the harvested charge. The harvesting process provides an uncontrolled harvested charge, which can then be sent to a regulator that down-converts the harvested charge into a logic supply voltage that has a constant voltage. The gate charge used to turn the power transistors on and off is initially drawn from either input voltage Vin or output voltage Vout, which in some embodiments can be itself derived from input voltage Vin by up-conversion. Gate charge harvesting can allow some of this charge to be recycled and down-converted to provide a logic-level voltage that is lower than the power gate voltage. By taking over part of the internal logic supply generation, an increase of the overall efficiency of the IC chip is provided.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. A DC/DC boost converter circuit comprising:
   a ground plane, a switch node adapted to be coupled to a voltage source through an inductor, and an output coupled to the switch node and adapted to be coupled to a first load;
   a power transistor having a drain and a source coupled in series between the ground plane and the switch node and having a gate;
   gate driver circuitry having an output coupled to the gate of the power transistor;
   a harvest capacitor having a first plate coupled to a harvested voltage output and having a second plate coupled to the ground plane;
   a harvest transistor having a first terminal coupled to the gate of the power transistor and having a second terminal coupled to the first plate; and
   a harvest regulator having an input coupled to the harvested voltage output and having a second load output coupled to a second load separate from the first load.

2. The DC/DC boost converter circuit of claim 1 including:
   an internal regulator having a input adapted to be coupled to the voltage source and having an internal regulator output;
   decision circuitry having an input coupled to the internal regulator output, an input coupled to the second load output, and a decision output;
   boost control circuitry having an input coupled to the decision output and a boost control output; and
   in which the gate driver circuitry has an input coupled to the boost control output.

3. The DC/DC boost converter circuit of claim 2 in which the internal regulator output provides an input logic supply voltage AVDDin.

4. The DC/DC boost converter of claim 2 in which the second load output provides a recycled supply voltage AVDDrecyl.

5. The DC/DC boost converter of claim 2 in which the decision output provides a multiplexed logic supply voltage AVDDmux.

6. The DC/DC boost converter of claim 2 in which the decision output provides a multiplexed logic supply voltage AVDDmux that includes an input logic supply voltage AVDDin from the internal regulator output and a recycled supply voltage AVDDrecyl from the second load output.

7. The DC/DC boost converter of claim 1 in which the power transistor is an NMOS transistor having the source connected to the ground plane and the drain connected to the switch node.

8. The DC/DC boost converter of claim 1 including a diode having an anode connected to the switch node and a cathode connected to the output.

9. The DC/DC boost converter of claim 1 in which the harvest transistor is an NMOS transistor having a drain connected to the gate of the power transistor and a source connected to the first plate.

10. The DC/DC boost converter of claim 1 in which the power transistor and harvest transistors are NMOS transistors.

11. The DC/DC boost converter of claim 1 in which the gate driver circuitry has an input coupled to the second load output.

12. The DC/DC boost converter of claim 1 in which the power transistor is a first power transistor and including a second power transistor having one terminal connected to the switch node, having another terminal connected to the output, and having a gate.

13. The DC/DC boost converter of claim 12 in which:
    the gate driver circuitry has a second output;
    the harvest transistor is a first harvest transistor; and including:
    a second harvest transistor having a first terminal coupled to the gate of the second power transistor and having a second terminal coupled to the first plate of the harvest capacitor.

14. The DC/DC boost converter of claim 13 in which the second power transistor is a PMOS transistor having a drain connected to the switch node and a source connected to the output.

15. The DC/DC boost converter of claim 13 in which the second harvest transistor is an NMOS transistor having a drain coupled to the gate of the second power transistor and a source coupled to the first plate of the harvest capacitor.

* * * * *